(12) United States Patent
Papana et al.

(10) Patent No.: US 9,157,966 B2
(45) Date of Patent: Oct. 13, 2015

(54) METHOD AND APPARATUS FOR ONLINE DETERMINATION OF BATTERY STATE OF CHARGE AND STATE OF HEALTH

(75) Inventors: Anki Reddy Papana, Karnataka (IN); Harmohan N. Singh, Rockaway Township, NJ (US); Hassan Ali Kojori, Mississauga (CA); Subodh Keshri, Karnataka (IN); David Lazarovich, Thornhill (CA)

(73) Assignee: HONEYWELL INTERNATIONAL INC., Morristown, NJ (US)

(*) Notice: Subject to any disclaimer, the term of this patent is extended or adjusted under 35 U.S.C. 154(b) by 886 days.

(21) Appl. No.: 13/304,596

(22) Filed: Nov. 25, 2011

(65) Prior Publication Data

US 2013/0138369 A1    May 30, 2013

(51) Int. Cl.
*G01R 15/12* (2006.01)
*G01R 15/14* (2006.01)
*G06F 3/00* (2006.01)
*G06F 3/01* (2006.01)
*G01R 31/36* (2006.01)

(52) U.S. Cl.
CPC ........ *G01R 31/3644* (2013.01); *G01R 31/3624* (2013.01); *G01R 31/3662* (2013.01); *G01R 31/3679* (2013.01)

(58) Field of Classification Search
CPC .................................................. G01R 31/3644

USPC ............... 702/57, 63, 64, 179, 182, 183, 189; 320/132; 324/426

See application file for complete search history.

(56) References Cited

U.S. PATENT DOCUMENTS

| | | | |
|---|---|---|---|
| 6,300,763 B1 * | 10/2001 | Kwok | 324/427 |
| 6,469,512 B2 * | 10/2002 | Singh et al. | 324/426 |
| 6,608,482 B2 * | 8/2003 | Sakai et al. | 324/426 |
| 7,154,247 B2 | 12/2006 | Kikuchi et al. | |
| 7,200,499 B2 | 4/2007 | Aridome | |
| 7,554,294 B2 * | 6/2009 | Srinivasan et al. | 320/132 |
| 7,576,545 B2 | 8/2009 | Singh et al. | |
| 7,893,652 B2 * | 2/2011 | Suzuki et al. | 320/104 |
| 2002/0145430 A1 * | 10/2002 | Arai et al. | 324/426 |
| 2005/0264263 A1 * | 12/2005 | Tsenter | 320/128 |
| 2009/0146664 A1 * | 6/2009 | Zhang | 324/433 |

* cited by examiner

*Primary Examiner* — Eliseo Ramos Feliciano
*Assistant Examiner* — Felix Suarez
(74) *Attorney, Agent, or Firm* — Shimokaji IP

(57) ABSTRACT

An online method and apparatus for determining state of charge (SoC) and state of health (SoH) of batteries on platforms that present dynamic charge and discharge environments is disclosed. A rested open circuit voltage (OCV) may be estimated online using a battery dynamic model along with measured terminal voltage, current and temperature. The SoC and SoH can then be determined from this estimated OCV. The apparatus and methods may estimate SoC and SoH of a battery in a real-time fashion without the need to a) disconnect the battery system from service; b) wait for a predefined rest time; or c) depolarize the battery.

10 Claims, 8 Drawing Sheets

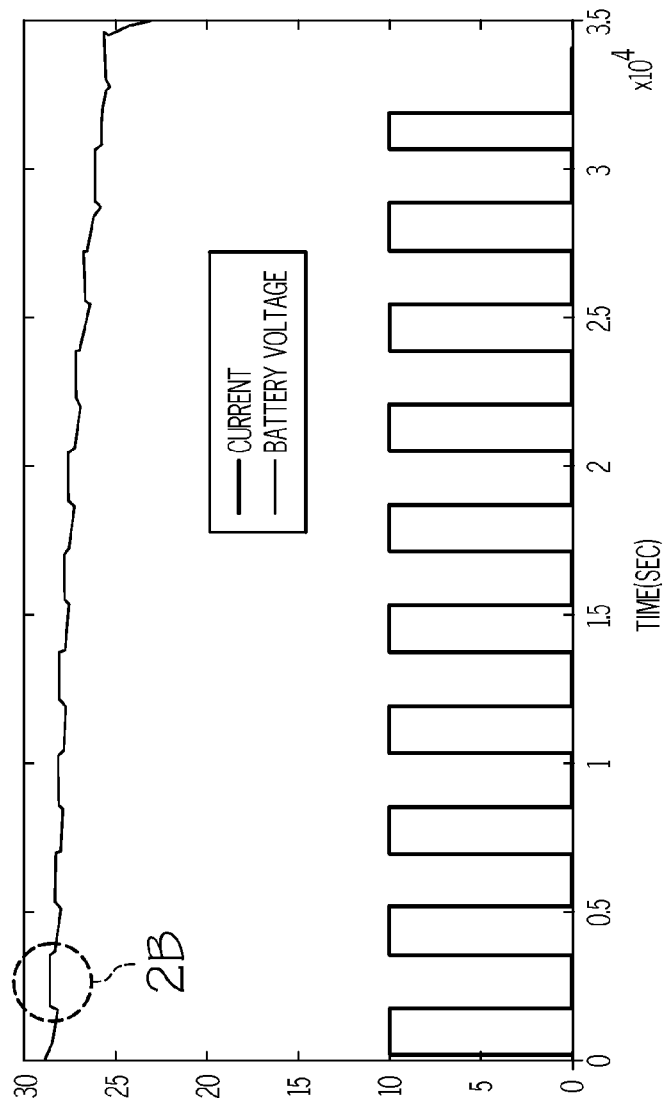
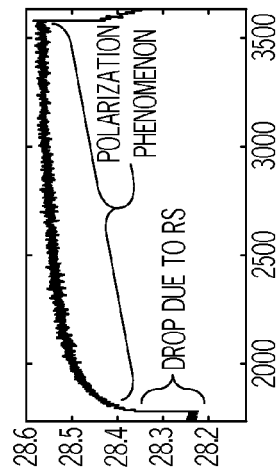
FIG. 2A (PRIOR ART)
FIG. 2B (PRIOR ART)

| | RESTED OPEN CIRCUIT VOLTAGE | | | | |
|---|---|---|---|---|---|
| | $V_{OC1}$ | $V_{OC2}$ | $V_{OC3}$ | ··· | $V_{OCn}$ |
| TEMP$_1$ | SOC$_{11}$ | SOC$_{12}$ | SOC$_{13}$ | ··· | SOC$_{1n}$ |
| TEMP$_2$ | SOC$_{21}$ | SOC$_{22}$ | SOC$_{23}$ | ··· | SOC$_{2n}$ |
| TEMP$_3$ | SOC$_{31}$ | SOC$_{32}$ | SOC$_{33}$ | | SOC$_{3n}$ |
| ⋮ | ⋮ | ⋮ | ⋮ | | ⋮ |
| TEMP$_m$ | SOC$_{m1}$ | SOC$_{m2}$ | SOC$_{m3}$ | ··· | SOC$_{mn}$ |

(left axis: TEMPERATURE)

FIG. 4

METHOD AND APPARATUS FOR ONLINE DETERMINATION OF BATTERY STATE OF CHARGE AND STATE OF HEALTH

BACKGROUND OF THE INVENTION

The present invention relates to apparatus and methods for determining battery state of charge (SoC) and state of health (SoH) and, more particularly, apparatus and methods for determining online battery SoC and SoH in a dynamic charge and discharge environment.

The rechargeable battery is a critical element of recently emerging micro-grid, electric vehicle (EV), plug-in hybrid electric vehicle (PHEV) and more electric aircraft (MEA) systems. These platforms require frequent charging and discharging of the batteries. For reliable operation and to preserve battery life, it is mandatory that accurate knowledge of battery state-of-charge (SoC) and prevailing battery state-of-health (SoH) are known. The prevailing battery capacity is the leading indicator of SoH.

Prior art provides several SoC and SoH determination techniques. However, these techniques can only be applied when the battery is in the off-line mode, i.e., in the laboratory environment, or when it is not being used to support the charge and discharge functions within the host environment. Due to the anomalous behavior of the battery under dynamic charge/discharge conditions, which occur in the online mode, these technique are either inapplicable or cannot provide accurate results.

The most basic technique for determining SoC is based upon the battery open circuit or rested voltage (OCV) measurement. The OCV is typically defined to be the battery terminal voltage after it has been rested at no load or charge for a predetermined time, from a minimum of 30 minutes to several hours. In case of many Li-ion and other battery chemistries, the OCV varies with the SoC and consequently cannot be used to compute the SoC. FIG. 1 provides an example of OCV-SoC correlation for the GS Yuasa 28V, 40Ah Li-ion battery at 0, 25 and 45° C. The Figure indicates a near linear relationship between the SoC and OCV in the approximately 10% SoC to 100% SoC range. The OCV vs. SoC plots are commonly available from the battery/cell suppliers, or can be developed through lab tests. Using this approach, algorithms have been developed with better than +/−5% SoC accuracy. However, this approach is unsuitable for online SoC determination in a dynamic charge/discharge environment where due to the polarization phenomenon, rested battery voltage is rarely available. The polarization phenomenon is illustrated in FIGS. 2A and 2B, which shows battery response to a repetitive 10A load pulse. The inset magnified plot of the battery voltage depicts a sudden jump in voltage upon removal of the load followed by much slower voltage recovery resulting in a long wait time for capturing the rested battery voltage. The wait time is usually not practical in the online environment.

The battery capacity fades with use and calendar time. If a battery's capacity has faded by 50%, at 100% SoC it will only have half the energy compared to when it was first fielded. Therefore, the SoC measurement alone is not sufficient to ensure effective operation of the battery within the system. Battery capacity which the main indicator of SoH should also be monitored.

In the prior art, methods which predict the battery capacity exist, but all these methods can only be implemented offline and require the wait time for battery to reach the equilibrium state. As described in U.S. Pat. No. 7,576,545, the full capacity of the battery can be determined through partially charging/discharging. This method starts with a known SoC state and, after a known amount of energy is added or subtracted, the rested open circuit voltage of the battery is measured to compute the new SoC. The full capacity ($C_{full}$) can then be obtained by correlating the charge/discharge energy ($\Delta E$) with the change in SoC ($\Delta SoC$) by equation (1)

$$C_{full} * \Delta SoC = \Delta E \tag{1}$$

where $\Delta SoC = |SoC_{after} - SoC_{before}|$. But, after partial charging/discharging, rested open circuit voltage needs be obtained through depolarization/predefined rest time, thus interrupting the system operation. This is not practical when the battery is online.

As can be seen, there is a need for an online technique for determining SoC and SoH of a battery.

SUMMARY OF THE INVENTION

In one aspect of the present invention, a system for determining a battery's state of charge and state of health comprises a measurement section having a voltage sensor, a current sensor and a temperature sensor, the measurement section adapted to take measurements from the battery; a power supply connected to the battery via a power supply switch; a load connected to the battery via a load switch; and a computer adapted to receive the measurements from the measurement section, the computer having a control card adapted to open and close the power supply switch and the load switch, the computer adapted to calculate an open circuit voltage online, without requiring a battery rest time.

In another aspect of the present invention, a method for determining a battery open circuit voltage online without requiring a battery rest time comprises charging or discharging the battery; computing the open circuit voltage using the equation $V_{OC} = V_{BAT} + \Delta V_R + \Delta V_P$, where $V_{BAT}$ is a battery terminal voltage, $\Delta V_R$ is a voltage drop due to battery resistance, and $\Delta V_P$ is a voltage drop due to polarization phenomenon; and determining the state of charge using the computed open circuit voltage and a battery temperature.

In a further aspect of the present invention, a method for determining the state of health of a battery comprises estimating full capacity of the battery by charging or discharging the battery; computing the open circuit voltage using the equation $V_{OC} = V_{BAT} + \Delta V_R + \Delta V_P$ where $V_{BAT}$ is a battery terminal voltage, $\Delta V_R$ is a voltage drop due to battery resistance, and $\Delta V_P$ is a voltage drop due to polarization phenomenon; determining the state of charge using the computed open circuit voltage and a battery temperature; and correlating charge or discharge energy with a change in state of charge and extrapolating to get full battery capacity; tracking the battery's full capacity as a function of time; and determining if the full capacity of the battery has declined a predetermined amount.

These and other features, aspects and advantages of the present invention will become better understood with reference to the following drawings, description and claims.

BRIEF DESCRIPTION OF THE DRAWINGS

FIG. 2A is a graph showing battery terminal voltage under dynamic load conditions;

FIG. 2B is a close-up portion of the graph of FIG. 2A;

FIG. 4 is a chart showing an exemplary look-up table;

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention provide an online method and apparatus for determining state of charge (SoC) and state of health (SoH) of batteries on platforms that present dynamic charge and discharge environments. A rested open circuit voltage (OCV) may be estimated online using a battery dynamic model along with measured terminal voltage, current and temperature. The SoC and SoH can then be determined from this estimated OCV. The apparatus and methods may estimate SoC and SoH of a battery in a real-time fashion without the need to a) disconnect the battery system from service; b) wait for a predefined rest time; or c) depolarize the battery.

Figure 5:
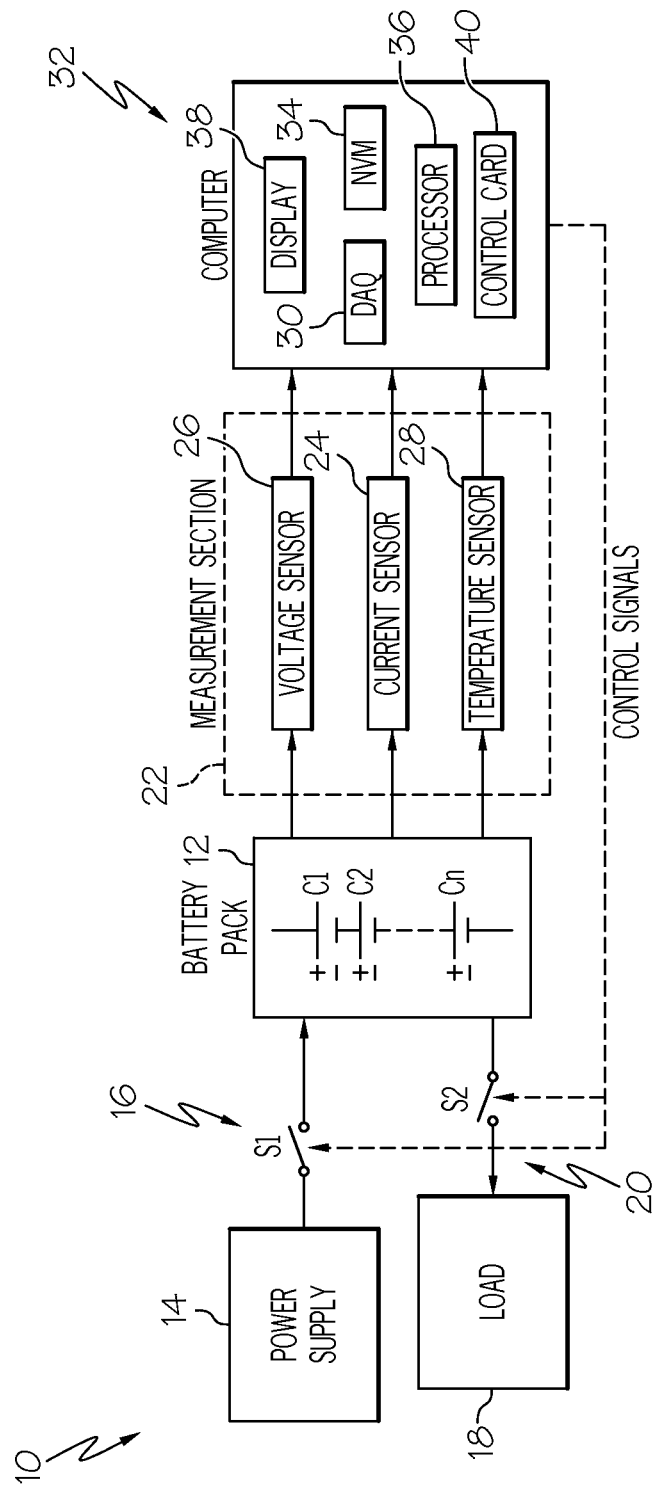
FIG. 5 is a schematic diagram showing a system for determining SoC and SoH according to an exemplary embodiment of the present invention.

Methods of the present invention, as described below, can be practiced using the components as shown in FIG. 5. A battery monitoring system 10 may include a battery 12 which may contain a single cell or number of cells in series and parallel. The system 10 may further include a fixed or programmable power supply 14 used for charging the battery 12 partially or fully, connected across the battery 12 with a controllable switch 16. The system 10 may also include a resistive load or programmable electronic load 18 for discharging the battery 12 with a constant current or predefined current shape, connected across the battery 12 with a controllable switch 20. A measurement section 22 may include an ammeter or current sensor 24, a volt meter or voltage sensor 26 and a temperature sensor 28 to sense and feed measurements to a data acquisition system (DAQ) 30. The system 10 may further include a computer or a processor 32 which contains the data acquisition system 30, non-volatile memory (NVM) 34 to store lookup tables and data, a processor 36 to execute the method and a display 38 to display battery performance data. The data acquisition system 30 may include sample and hold circuits, A/D converters and non-diffusion filters (not shown) to eliminate sensor noise. The computer 32 may control the charging and discharging cycle of the battery 12 by controlling the switches 16, 20 via a control card 40.

Exemplary embodiments of the present invention provide methods to compute rested open circuit voltage online. The online method may use a battery dynamic model along with measured terminal voltage, current, and temperature to estimate open circuit voltage. The battery model could be any linear/nonlinear equivalent electrical model which represents battery characteristics. The battery model may contain resistance, capacitance and inductance in series with a dependent voltage source. The model parameters can be identified through pulse current charge/discharge. For developing the model, tests may be performed at different temperatures for a range of charge/discharge currents. The battery open circuit voltage can be computed online using the equation (2) related to the model. The SoC can be estimated using the computed OCV and temperature through a lookup table/algebraic equation $$V_{OC} = V_{BAT} + \Delta V_R + \Delta V_P \qquad (2)$$

where $V_{BAT}$—Battery terminal voltage, $\Delta V_R$—Voltage drop due to battery resistance, and $\Delta V_P$—Voltage drop due to polarization phenomenon.

Figure 6:
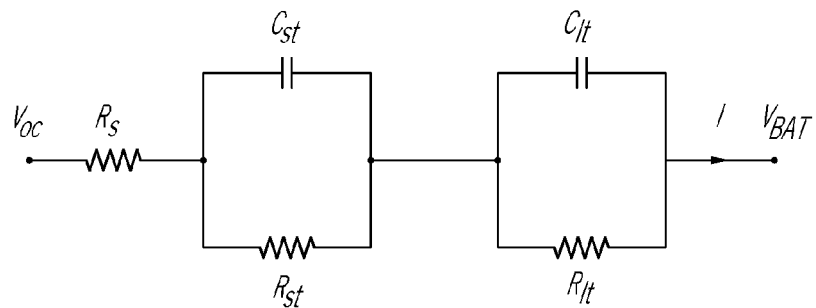
FIG. 6 is a schematic diagram showing a battery model including a resistance ($R_s$) in series with two RC branches according to an exemplary embodiment of the present invention.

Referring to FIG. 6, these values can be calculated using an electrical model which represents the characteristics of an Li Ion battery, for example. The battery model may include a resistance ($R_s$) in series with two RC branches as shown in FIG. 6. Each RC branch may contain a parallel combination of resistance and capacitance.

The battery terminal voltage ($V_{BAT}$) may be measured using a voltage sensing device which could be connected across the battery terminals.

The voltage drop due to battery internal resistance ($\Delta V_R$) can be computed using the equation $$\Delta V_R = I * R_s \qquad (3)$$

where $R_s$ is the battery internal resistance, and

I is the current through battery terminals.

The polarization phenomenon can be represented using the two RC branches in series as shown in FIG. 6, and the drop due to this phenomenon can be computed using the equation $$\Delta V_P = I * \left[ \left( \frac{R_{st}}{1 + (R_{st} \cdot C_{st})s} \right) + \left( \frac{R_{lt}}{1 + (R_{lt} \cdot C_{lt})s} \right) \right] \qquad (4)$$

where $R_{st}$ and $C_{st}$ are elements of first RC branch which represents the polarization phenomenon for short time just after keeping the battery in rest, and $R_{lt}$ and $C_{lt}$ are the elements of second RC branch which represents the polarization phenomenon for long time just after keeping the battery in rest.

The Equation (2) can thus be written as follows $$V_{OC} = V_{BAT} + I * R_s + I * \left[ \left( \frac{R_{st}}{1 + (R_{st} \cdot C_{st})s} \right) + \left( \frac{R_{lt}}{1 + (R_{lt} \cdot C_{lt})s} \right) \right] \qquad (5)$$

The initial battery parameters can be estimated from the battery response just after removing the load. As discussed in the previous section, the sudden jump in the voltage is due to battery internal resistance ($R_s$) and can be estimated from the equation (6).

$$R_s = \left| \frac{V_{BAT_{afterloadremoved}} - V_{BAT_{wishload}}}{I} \right| \qquad (6)$$

Figure 1:
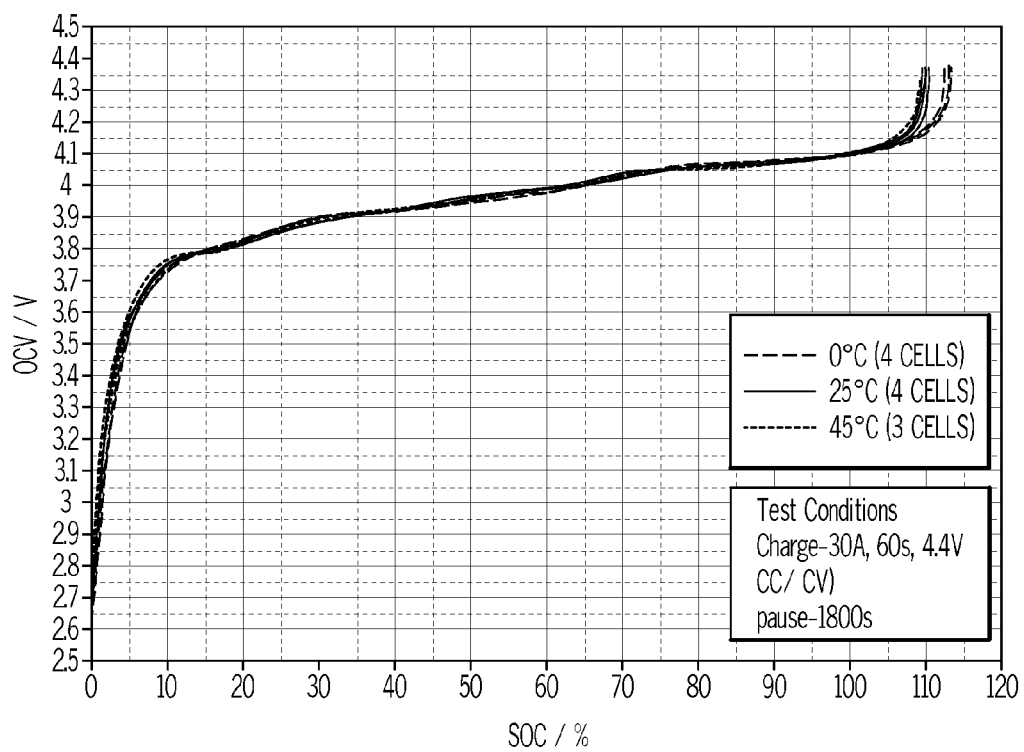
FIG. 1 is a graph showing rested battery voltage versus battery state of charge, as is known in the art.
Figure 3:
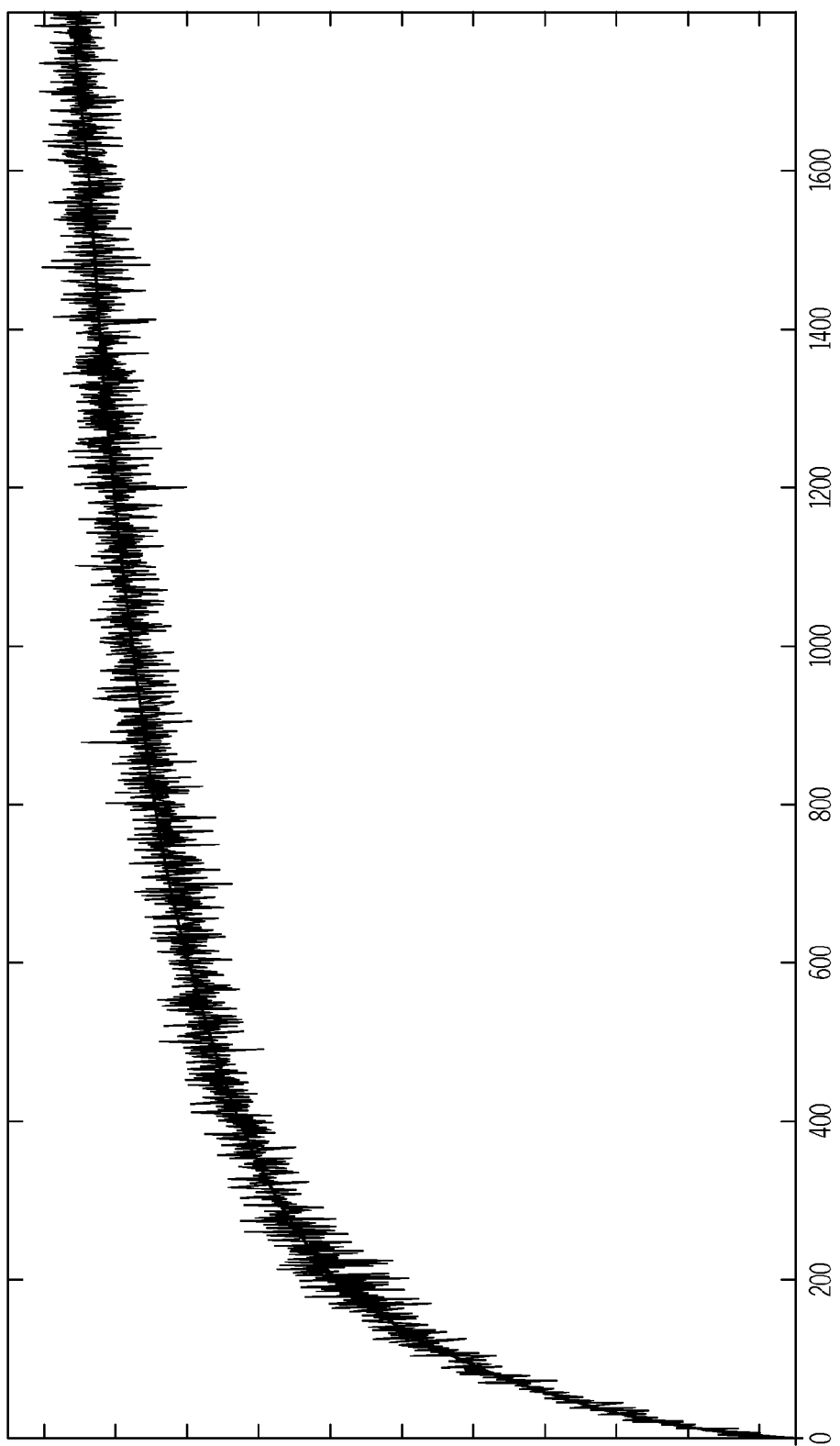
FIG. 3 is a graph showing voltage recovery over time due to polarization phenomenon.

The slow voltage recovery due to polarization phenomenon can be best fitted with the equation (7) as shown in FIG. 3.

$$v(t) = a \cdot e^{bt} + c \cdot e^{dt} \qquad (7)$$

The battery polarization parameters ($R_{st}$, $C_{st}$, $R_{lt}$ and $C_{lt}$) can be calculated form the coefficients a, b, c and d of the equation (7) as follows.

$$R_{st} = \frac{a}{I} \qquad (8)$$

$$C_{st} = \frac{1}{(b * R_{st})} \qquad (9)$$

$$R_{lt} = -\frac{c}{I} \qquad (10)$$

$$C_{lt} = \frac{1}{(d * R_{lt})} \qquad (11)$$

This process can be repeated at different SOC levels for different loads at different operating temperatures. The best suited parameters can be identified and validated through circuit simulation, using any circuit simulator. These values for a new 28V, 40Ah Li Ion battery are as follows:
$R_s$=0.01388 Ohms;
$R_{st}$=0.01394 Ohms;
$C_{st}$=11031.218 F;
$R_{lt}$=0.01531 Ohms; and
$C_{lt}$=4662154.6 F.

These battery parameters change with usage and aging of the battery. These parameters can be estimated at regular intervals by monitoring and storing the battery data for different system loads in real time.

Embodiments of the present invention also disclose methods for online model update due to battery parameter changes due cycling and aging. For this purpose, battery characterization may performed online by monitoring response to suitable systems loads; voltage, current and temperature are the parameters used in this process.

Figure 7:
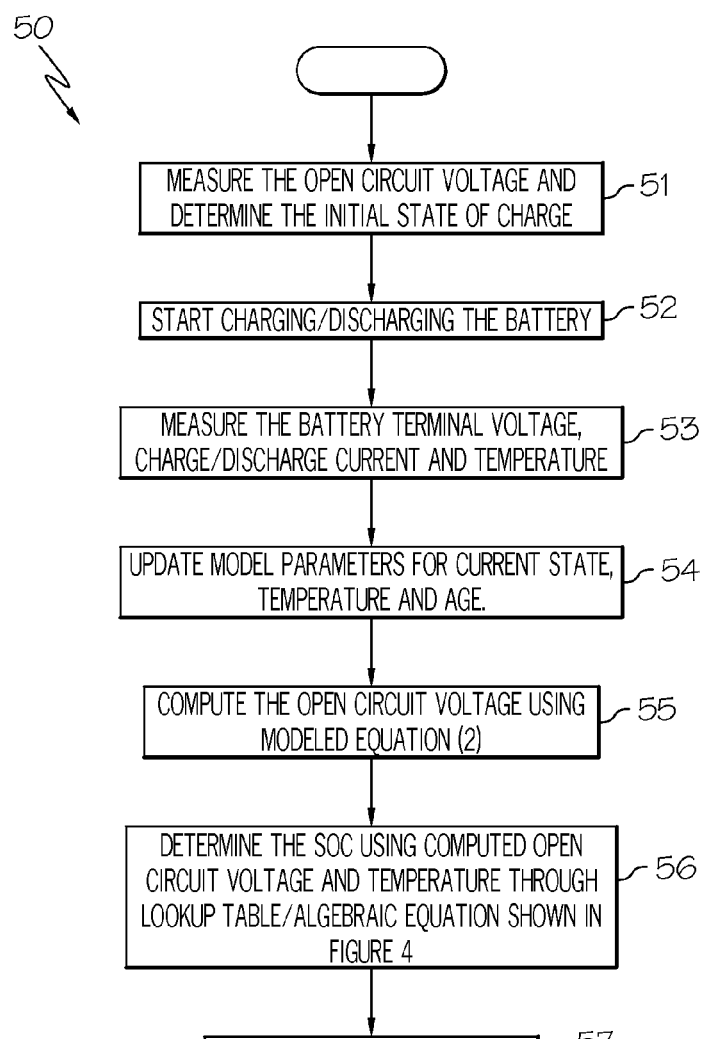
FIG. 7 is a flow chart showing a method for determining battery SoC according to an exemplary embodiment of the present invention.

Referring now to FIG. 7, a method 50 for determining battery state of charge is described according to an exemplary embodiment of the present invention. At step 51, an OCV may be measured and an initial SoC may be determined. At this point, polarization may not be an issue, since the battery is already in a rested state. At step 52, charging/discharging of the battery may begin and, at step 53, the battery terminal voltage, charge/discharge current, and temperature may be measured. At optional step 54, model parameters may be updated for current state, temperature and age of the battery. At step 55, the OCV may be calculated using the equation (2) described above. At step 56, the SoC may be determined using the calculated OCV from step 55 and temperature through look up tables or through algebraic equations. At step 56, this SoC may be returned to be stored in memory, displayed to a user, or the like.

Figure 8:
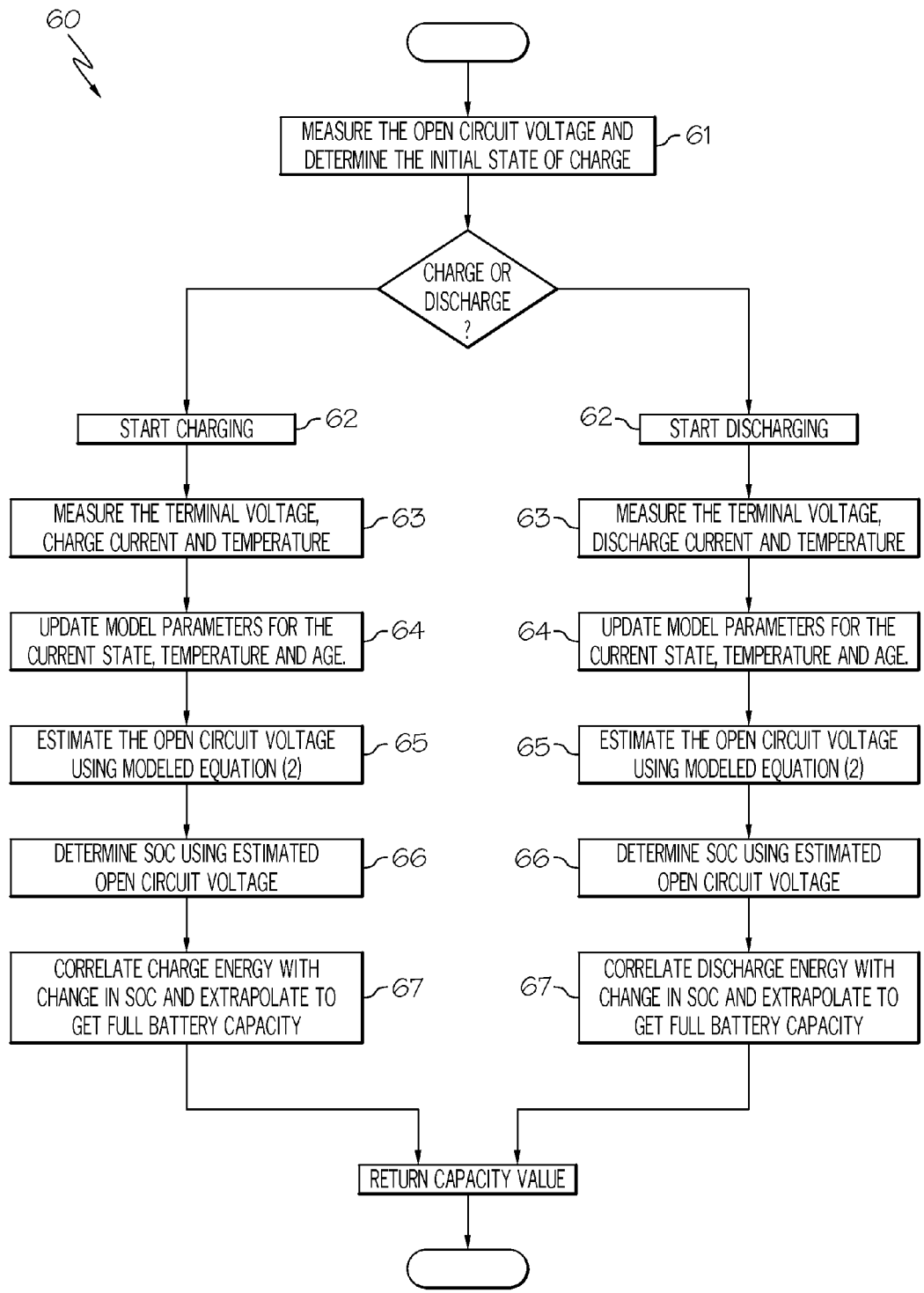
FIG. 8 is a flow chart showing a method for measuring battery capacity according to an exemplary embodiment of the present invention.

Referring now to FIG. 8, a method 60 is described to determine battery capacity, according to an exemplary embodiment of the present invention. In a step 61, an OCV may be measured and an initial SoC may be determined. At this point, polarization may not be an issue, since the battery is already in a rested state. At step 62, charging/discharging of the battery may begin and, at step 63, the battery terminal voltage, charge/discharge current, and temperature may be measured. If the method 60 is charging the battery, the method 60 may follow the left-hand side of the flow chart. If the method 60 is discharging the battery, the method 60 may follow the right-hand side of the flow chart. At optional step 64, model parameters may be updated for current state, temperature and age of the battery. At step 65, the OCV may be estimated using the equation (2) described above. At step 66, the SoC may be determined using the estimated OCV. At step 67, the charge/discharge energy used may be correlated with a change in SoC and the full battery capacity may be extrapolated. Additional details for step 67 may be found in U.S. Pat. No. 7,576,545, the contents of which are herein incorporated by reference.

Figure 9:
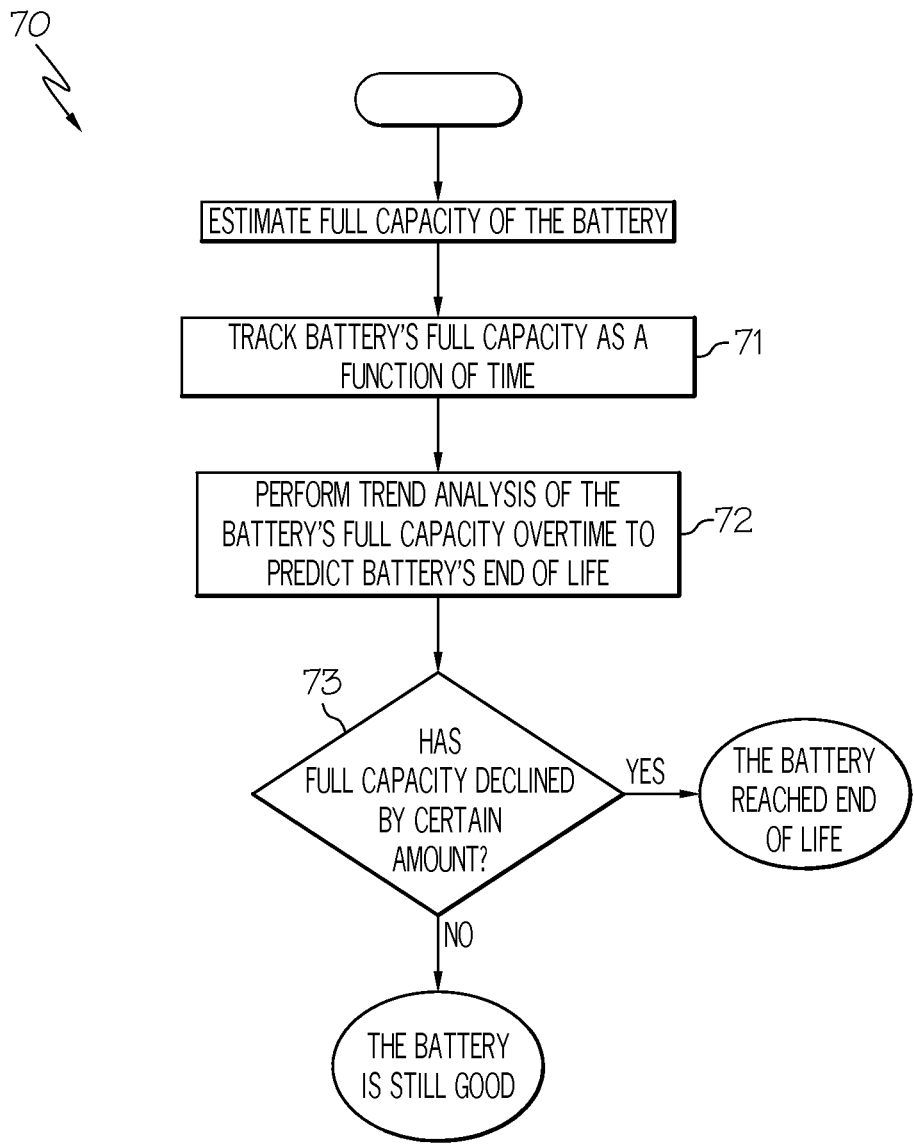
FIG. 9 is a flow chart showing a method for determining battery SoH according to an exemplary embodiment of the present invention.

Referring now to FIG. 9, a method 70 for determining a battery SoH is described. The method 60 may use the estimated full capacity of the battery, as determined in the method described above with reference to FIG. 8. The method 70 may include a step 71 of tracking the battery's full capacity as a function of time and a step 72 of preforming trend analysis of the battery's full capacity over time to predict the battery's end of life. Once the battery's full capacity has declined by a certain amount, the method 70 includes a decision point 73 that, if the battery's capacity has declined by at least that certain amount, then a determination is made that the battery has reached its end of life, otherwise, the battery is determined to be still good and its use may be continued.

The available full capacity of the battery is one of the key parameters which decide the life time of the battery. The above described methods may include a mechanism to track the full capacity of the battery as a function of time and perform a trend analysis of battery's full capacity overtime to predict battery's end of life and suggests for battery replacement.

Methods of the present invention address the problems of estimation of the SoC and SoH of a battery in a real-time fashion without the need to a) disconnect battery system from service, b) wait for a predefined rest time, and c) to depolarize the battery.

It should be understood, of course, that the foregoing relates to exemplary embodiments of the invention and that modifications may be made without departing from the spirit and scope of the invention as set forth in the following claims.

We claim:
1. A system for determining on-line battery's state of charge, the system comprising:
a measurement section having a voltage sensor, a current sensor and a temperature sensor, the measurement section adapted to take on-line measurements from the battery;
a computer having a battery dynamic model stored in a non-volatile memory, the battery dynamic model including various values of parameters $R_s$, $C_{st}$, $R_{st}$, $C_{lt}$ and $R_{lt}$ determined at various temperatures, terminal voltages and currents while the battery is off line, the parameters being elements of a battery model that includes:
a resistance $R_s$ in series with a first and a second RC branch;
the first RC branch representing a polarization phenomenon for short time just after keeping the battery in rest;
the first RC branch including a capacitor $C_{st}$ connected in parallel with a resistor $R_{st}$;
the second RC branch representing the polarization phenomenon for long time just after keeping the battery in rest;
the second RC branch including a capacitor $C_{lt}$ connected in parallel with a resistor $R_{lt}$;

a computer having a processor adapted to receive the on-line measurements from the measurement section and to calculate an open circuit voltage online, using an equation $$V_{OC} = V_{BAT} + \Delta V_R + \Delta V_P$$

where $V_{BAT}$—Battery terminal voltage, $\Delta V_R$—Voltage drop due to battery resistance, and $\Delta V_P$—Voltage drop due to polarization phenomenon;

wherein $\Delta V_P$ is computed using an equation $$\Delta V_P = I * \left[\left(\frac{R_{st}}{1+(R_{st} \cdot C_{st})s}\right) + \left(\frac{R_{lt}}{1+(R_{lt} \cdot C_{lt})s}\right)\right]$$

in which values of $R_s$, $C_{st}$, $R_{st}$, $C_{lt}$ and $R_{lt}$ are determined from the battery dynamic model by comparing the received on-line measurements to the battery dynamic model; and a display unit for displaying the state of charge of the online battery.

2. The system of claim 1, further comprising a data acquisition system for collecting the data from the measurement section.

3. The system of claim 1, wherein the non-volatile memory includes a lookup table that correlates open circuit voltage with battery state of charge.

4. A computer implemented method for determining a state of charge of an on-line battery, the method comprising:

determining various values of parameters $R_s$, $C_{st}$, $R_s$, $C_{lt}$ and $R_{lt}$ at various temperatures, terminal voltages and currents while the battery is off line, the parameters being elements of a battery model that includes:

a resistance $R_s$ in series with a first and a second RC branch;

the first RC branch representing a polarization phenomenon for short time just after keeping the battery in rest;

the first RC branch including a capacitor $C_{st}$ connected in parallel with a resistor $R_{st}$;

the second RC branch representing the polarization phenomenon for long time just after keeping the battery in rest;

the second RC branch including a capacitor $C_{lt}$ connected in parallel with a resistor $R_{lt}$;

constructing a battery dynamic model that correlates the various off-line battery temperatures, terminal voltages and currents with the various values of parameters $R_s$, $C_{st}$, $R_{st}$, $C_{lt}$ and $R_{lt}$ storing the battery dynamic model in a non-volatile memory of a computer;

receiving, at a processor of the computer, on-line measurements of battery temperature, terminal voltage, and current;

computing, using the processor of the computer, an open circuit voltage online without requiring a battery rest time using an equation $$V_{OC} = V_{BAT} + \Delta V_R + \Delta V_P$$

where $V_{BAT}$—Battery terminal voltage, $\Delta V_R$—Voltage drop due to battery resistance, and $\Delta V_P$—Voltage drop due to polarization phenomenon;

wherein $\Delta V_P$ is computed using an equation $$\Delta V_P = I * \left[\left(\frac{R_{st}}{1+(R_{st} \cdot C_{st})s}\right) + \left(\frac{R_{lt}}{1+(R_{lt} \cdot C_{lt})s}\right)\right]$$

in which values of $R_s$, $C_{st}$, $R_{st}$, $C_{lt}$ and $R_{lt}$ are determined from the battery dynamic model by comparing the received on-line measurements to the battery dynamic model;

determining, using the processor of the computer, the state of charge of the on line battery using the computed open circuit voltage and the received on line battery measurements; and producing a display of the determined state of charge on a display unit.

5. The method of claim 4, further comprising periodically updating model parameters for current, state of charge, temperature and battery age.

6. The method of claim 4, further comprising measuring $V_{BAT}$ using a voltage sensing connected across terminals of the battery.

7. The method of claim 4, further comprising correlating charge or discharge energy with a change in state of charge and extrapolating to get full battery capacity.

8. A computer implemented method for determining a state of health of on-line battery, comprising:

determining various values of parameters $R_s$, $C_{st}$, $R_{st}$, $C_{lt}$ and $R_{lt}$ at various temperatures, terminal voltages and currents while the battery is off line, the parameters being elements of a battery model that includes:

a resistance $R_s$ in series with a first and a second RC branch;

the first RC branch representing a polarization phenomenon for short time just after keeping the battery in rest;

the first RC branch including a capacitor $C_{st}$ connected in parallel with a resistor $R_{st}$;

the second RC branch representing the polarization phenomenon for long time just after keeping the battery in rest;

the second RC branch including a capacitor $C_{lt}$ connected in parallel with a resistor $R_{lt}$;

constructing a battery dynamic model that correlates the various off-line battery temperatures, terminal voltages and currents with the various values of parameters $R_s$, $C_{st}$, $C_{lt}$, $R_{lt}$;

storing the battery dynamic model in a non-volatile memory of a computer; estimating, using a processor of a computer, a full capacity of the battery by:

charging or discharging the battery while the battery is on line;

computing, using a processor of a computer, an open circuit voltage of the online battery using an equation $$V_{OC} = V_{BAT} + \Delta + \Delta V_P$$

where $V_{BAT}$—Battery terminal voltage, $\Delta V_R$—Voltage drop due to battery resistance, and $\Delta V_P$—Voltage drop due to polarization phenomenon;

receiving, at a processor of the computer, on-line measurements of battery temperature, terminal voltage, and current;

wherein $\Delta V_P$ is computed using an equation $$\Delta V_P = I * \left[\left(\frac{R_{st}}{1+(R_{st} \cdot C_{st})s}\right) + \left(\frac{R_{lt}}{1+(R_{lt} \cdot C_{lt})s}\right)\right]$$

in which values of $R_s$, $C_{st}$, $R_{st}$, $C_{lt}$ and $R_{lt}$ are determined from the battery dynamic model by comparing the received on-line measurements to the battery dynamic model;

determining, using the processor of the computer, the state of charge using the computed open circuit voltage and the received battery temperature measurement; and correlating, using the processor, charge or discharge energy with a change in state of charge and extrapolating, using the processor, to get full battery capacity;

tracking, using the processor, a full capacity of the battery as a function of time; and determining, using the processor, if the full capacity of the battery has declined a predetermined amount, wherein a decline in the full capacity of the battery is indicative of a state of health of the battery; and producing a display of the determined state of health on a display unit.

9. The method of claim 8, further comprising performing trend analysis of the battery's full capacity over time to predict the battery's end of life.

10. The method of claim 8, further comprising measuring $V_{BAT}$ using a voltage sensing connected across terminals of the battery.

* * * * *